(12) United States Patent
Miyanaga et al.

(10) Patent No.: US 8,853,683 B2
(45) Date of Patent: Oct. 7, 2014

(54) SEMICONDUCTOR DEVICE, MEASUREMENT APPARATUS, AND MEASUREMENT METHOD OF RELATIVE PERMITTIVITY

(75) Inventors: Akiharu Miyanaga, Hadano (JP); Tatsuya Honda, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 599 days.

(21) Appl. No.: 12/966,186

(22) Filed: Dec. 13, 2010

(65) Prior Publication Data
US 2011/0147736 A1 Jun. 23, 2011

(30) Foreign Application Priority Data

Dec. 17, 2009 (JP) ................. 2009-286234

(51) Int. Cl.
| | |
|---|---|
| H01L 29/10 | (2006.01) |
| H01L 29/12 | (2006.01) |
| H01L 29/786 | (2006.01) |
| H01L 29/66 | (2006.01) |
| H01L 29/94 | (2006.01) |

(52) U.S. Cl.
CPC ............ *H01L 29/94* (2013.01); *H01L 29/7869* (2013.01); *H01L 29/66742* (2013.01); *H01L 29/78606* (2013.01)
USPC ..................................... 257/43; 257/E29.296

(58) Field of Classification Search
USPC ............................................ 257/43, E29.296
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |

(Continued)

FOREIGN PATENT DOCUMENTS

| | | |
|---|---|---|
| EP | 1737044 A | 12/2006 |
| EP | 1 770 788 | 4/2007 |

(Continued)

OTHER PUBLICATIONS

Translation of JP 2001-127126.*

(Continued)

*Primary Examiner* — Daniel Luke
*Assistant Examiner* — Latanya N Crawford
(74) *Attorney, Agent, or Firm* — Eric J. Robinson; Robinson Intellectual Property Law Office, P.C.

(57) ABSTRACT

The field of an oxide semiconductor has been attracted attention in recent years. Therefore, the correlation between electric characteristics of a transistor including an oxide semiconductor layer and physical properties of the oxide semiconductor layer has not been clear yet. Thus, a first object is to improve electric characteristics of the transistor by control of physical properties of the oxide semiconductor layer. A semiconductor device including at least a gate electrode, an oxide semiconductor layer, and a gate insulating layer sandwiched between the gate electrode and the oxide semiconductor layer, where the oxide semiconductor layer has the relative permittivity of equal to or higher than 13 (or equal to or higher than 14), is provided.

5 Claims, 5 Drawing Sheets

(56) References Cited

U.S. PATENT DOCUMENTS

| | | | |
|---|---|---|---|
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,188,467 B2 | 5/2012 | Itagaki et al. | |
| 8,268,194 B2* | 9/2012 | Kim et al. | 252/500 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0138941 A1* | 6/2007 | Jin et al. | 313/503 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197350 A1* | 8/2008 | Park et al. | 257/43 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0051957 A1* | 3/2010 | Kim et al. | 257/72 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0213459 A1 | 8/2010 | Shimada et al. | |
| 2010/0243994 A1* | 9/2010 | Yoon et al. | 257/40 |
| 2011/0111535 A1* | 5/2011 | Yamazaki et al. | 438/17 |
| 2011/0121878 A1* | 5/2011 | Kato et al. | 327/215 |

FOREIGN PATENT DOCUMENTS

| | | | |
|---|---|---|---|
| EP | 2226847 A | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 04-361576 | 12/1992 | |
| JP | 05-251705 A | 9/1993 | |
| JP | 08-264794 A | 10/1996 | |
| JP | 09-005373 | 1/1997 | |
| JP | 09-092792 A | 4/1997 | |
| JP | 11-505377 | 5/1999 | |
| JP | 2001-127126 | * 10/1999 | H01L 29/94 |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2003-347381 | 12/2003 | |
| JP | 2004-103957 A | 4/2004 | |
| JP | 2004-273614 A | 9/2004 | |
| JP | 2004-273732 A | 9/2004 | |
| JP | 2007-073701 A | 3/2007 | |
| JP | 2007-123861 | 5/2007 | |
| JP | 2008-300518 A | 12/2008 | |
| JP | 2009-099944 | 5/2009 | |
| WO | WO-2004/114391 | 12/2004 | |
| WO | WO-2008/149754 | 12/2008 | |
| WO | WO-2009/041544 | 4/2009 | |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar (56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charged-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids(Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2010/072512), Dated Mar. 8, 2011.

Written Opinion (Application No. PCT/JP2010/072512), Dated Mar. 8, 2011.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Fujii et. al., "Experimental and Theoretical Analysis of Degradation in Ga2O3-In2O3-ZnO Thin-Film Transistors," Jpn. J. Appl. Phys. (Japanese Journal of Applied Physics), vol. 48, 2009, pp. 04C091-1-04C091-6.

Su L., et al., Demonstration of Low Subthreshold Swing a-InGaZnO Thin Film Transistors, CS Mantech Conference, Boston, Massachusetts, USA, Apr. 23-26, 2012 (4 pages).

* cited by examiner

SEMICONDUCTOR DEVICE, MEASUREMENT APPARATUS, AND MEASUREMENT METHOD OF RELATIVE PERMITTIVITY

TECHNICAL FIELD

The technical field relates to an oxide semiconductor, a novel MOS capacitor (measurement apparatus), and the like.

BACKGROUND ART

In Non-Patent Document 1 and Non-patent Document 2, a transistor including an oxide semiconductor layer is disclosed.

REFERENCE

Non-Patent Document

[Non-Patent Document 1] T. C. Fung et. al., AM-FPD '08 Digest of Technical Papers
[Non-Patent Document 2] M. Fujii et. al., Jpn. J. Appl. Phys. 48, 2009, C4C091

DISCLOSURE OF INVENTION

The field of an oxide semiconductor has been attracted attention in recent years.

Therefore, the correlation between electric characteristics of a transistor including an oxide semiconductor layer and physical properties of the oxide semiconductor layer has not been clear yet.

Thus, a first object is to improve electric characteristics of the transistor by control of physical properties of the oxide semiconductor layer.

A second object is to provide a novel structural body and a novel measurement method used for measuring the physical properties of the oxide semiconductor layer.

Note that the invention to be disclosed below achieves at least one of the first object and the second object.

First, the first object will be described.

The present inventors pay attention to relative permittivity of the oxide semiconductor layer.

The on current of a metal oxide semiconductor (MOS) transistor is proportional to the charge density Q of carries induced at an oxide-semiconductor interface (an interface between an oxide film (a gate insulating layer) and a semiconductor layer).

Note that the charge density Q is represented by the following formula.

[FORMULA 1]

$$Q = C_{ox}(V_{gs} - V_{th} - \psi) \quad (1)$$

In the formula, $C_{ox}$ indicates the capacitance of an insulating film per unit area; $V_{gs}$, the difference between potential applied to a gate electrode and potential applied to a source electrode; $V_{th}$, the threshold voltage; and $\psi$, the surface potential.

Further, the surface potential $\psi$ is represented by the following formula.

[FORMULA 2]

$$\phi = e \times N_d \times \frac{W_d^2}{2\varepsilon_0 \varepsilon} \quad (2)$$

In the formula, e indicates the electron charge; $N_d$, the space charge density; $W_d$, the width of a depletion layer; $\varepsilon_0$, the vacuum permittivity; and $\varepsilon$, the relative permittivity of the oxide semiconductor.

From Formula 2, it is found that the surface potential $\psi$ becomes small as relative permittivity $\varepsilon$ increases.

In addition, it is found from Formula 1 that the charge density Q of carriers induced at the oxide-semiconductor interface becomes increased as the surface potential $\psi$ decreases.

That is, a decrease in the surface potential $\psi$ brings an increase in on current of the transistor.

The above consideration suggested that on current of the transistor in which an oxide semiconductor is used for an active layer can be increased by making relative permittivity of the oxide semiconductor higher.

That is, it is preferable that the oxide semiconductor layer serving as an active layer have high relative permittivity in order to obtain a transistor with high on current or high drive force.

Then, an oxide semiconductor layer having higher relative permittivity than those described in Non-Patent Document 1 and Non-Patent Document 2 (i.e., an oxide semiconductor layer whose relative permittivity is 13 or more) was achieved. Note that Non-Patent Document 1 discloses that the relative permittivity of the oxide semiconductor is 10, and Non-Patent Document 2 discloses that the relative permittivity of the oxide semiconductor is 12.

As described above, a novel oxide semiconductor layer with higher relative permittivity than the conventional one was manufactured.

Thus, with use of the novel oxide semiconductor layer with higher relative permittivity than the conventional one, a transistor with high on current or high drive force can be manufactured.

In the oxide semiconductor layer, the relative permittivity is likely to be increased as the carrier density becomes small.

That is, by reducing the carrier density in the oxide semiconductor layer, the relative permittivity can be increased.

Note that the factor of generation of carriers includes an oxygen vacancy, a donor, an acceptor, and the like.

Further, it is revealed that a substance including a hydrogen atom functions as a donor, from the experimental result and the consideration thereof conducted by the present inventors. Note that the term a "substance including a hydrogen atom" includes hydrogen, water, hydroxide, hydride, and the like.

Next, the second object will be described.

Figure 4A:
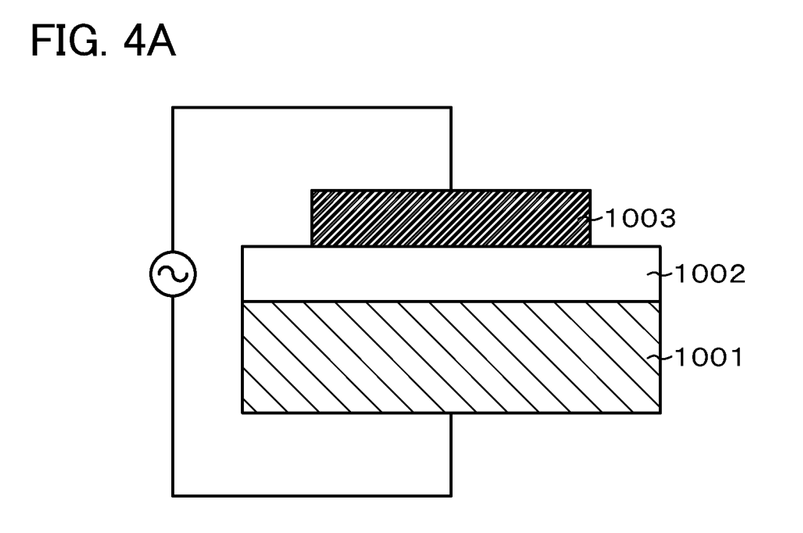
FIGS. 4A and 4B illustrate examples of MOS capacitors (measurement apparatuses).
Figure 4B:
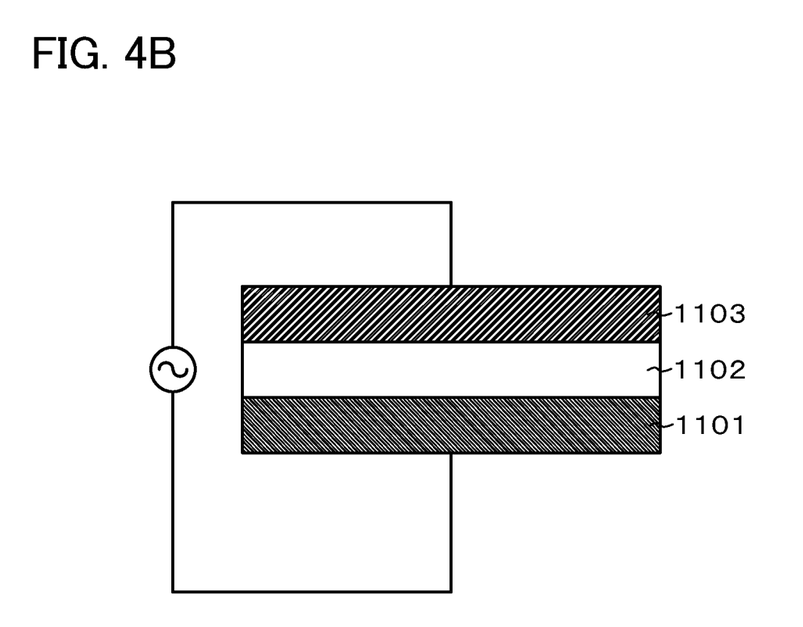

A method for measuring relative permittivity is conducted using a structure illustrated in FIG. 4B where an oxide semiconductor layer 1102 (Oxide Semiconductor) is sandwiched between a first electrode 1101 ($1^{st}$ metal) and a second electrode 1103 ($2^{nd}$ metal). The AC voltage is applied to the first electrode 1101 ($1^{st}$ metal) and the second electrode 1103 ($2^{nd}$ metal), and capacitance of the oxide semiconductor layer 1102 serving as a dielectric is measured. Then, the relative permittivity may be calculated using the measured capacitance value of the oxide semiconductor layer 1102.

However, although the structural body illustrated in FIG. 4B was formed and the AC voltage was applied thereto in practice, the capacitance could not be measured with use of the structural body of FIG. 4B.

The reason why the capacitance could not be measured was considered due to the ohmic contact was formed between the electrodes and the oxide semiconductor layer and carriers were injected to the oxide semiconductor layer, which prevented accumulation of charges in the electrodes.

As described above, it is difficult to measure the relative permittivity of the oxide semiconductor layer which is a semi-insulating layer with use of the general measurement method. Note that there are no description about the measurement method of relative permittivity in Non-Patent Document 1 and Non-Patent Document 2.

Thus, a novel structural body used for measurement of relative permittivity of the oxide semiconductor layer was manufactured.

Specifically, a MOS capacitor (measurement apparatus) with a structural body illustrated in FIG. 4A was manufactured. In the MOS capacitor (measurement apparatus), an oxide semiconductor layer 1002 (Oxide Semiconductor) is provided over a silicon wafer 1001 (Silicon Wafer) and a gate electrode layer 1003 (Gate Electrode) is provided over the oxide semiconductor layer 1002 (Oxide Semiconductor).

The MOS capacitor (measurement apparatus) is used for a measurement of relative permittivity of the oxide semiconductor layer.

Then, the saturation capacitance $C_a$ in an accumulation state of the MOS capacitor (measurement apparatus) is measured, and the measured saturation capacitance $C_a$ in an accumulation state is substituted into the following formula, whereby the relative permittivity can be calculated.

[FORMULA 3]

$$\varepsilon = C_a \frac{1}{\varepsilon_0} \frac{d}{S} \quad (4)$$

Thus, a semiconductor device including a gate electrode, an oxide semiconductor layer, and a gate insulating layer sandwiched between the gate electrode and the oxide semiconductor layer can be provided. In the semiconductor device, the relative permittivity of the oxide semiconductor layer is equal to or higher than 13.

Further, a semiconductor device including a gate electrode, an oxide semiconductor layer, and a gate insulating layer sandwiched between the gate electrode and the oxide semiconductor layer can be provided. In the semiconductor device, the relative permittivity of the oxide semiconductor layer is equal to or higher than 14.

The oxide semiconductor layer can contain indium, gallium, zinc, and oxygen as its main component.

Further, a measurement apparatus including a semiconductor, an oxide semiconductor layer provided over the semiconductor, and a gate electrode provided over the oxide semiconductor layer can be manufactured. In the measurement apparatus, the band gap of the semiconductor is smaller than the band gap of the oxide semiconductor layer.

Further, a measurement apparatus which is used for measuring a relative permittivity of an oxide semiconductor layer and includes a semiconductor, an oxide semiconductor layer provided over the semiconductor, and a gate electrode provided over the oxide semiconductor layer can be provided. In the measurement apparatus, the band gap of the semiconductor is smaller than the band gap of the oxide semiconductor layer.

Further, a method for measuring a relative permittivity including the steps of: forming a measurement apparatus including a semiconductor, an oxide semiconductor layer provided over the semiconductor, and a gate electrode provided over the oxide semiconductor layer, the oxide semiconductor layer having a wider band gap than the semiconductor; calculating a capacitance $C_a$ in an accumulation region of C-V characteristics of the measurement apparatus; and calculating a relative permittivity $\in$ of the oxide semiconductor layer by substituting the capacitance $C_a$ into the following formula can be provided. In the formula, $\in_0$ is a vacuum permittivity, S is an area of the gate electrode, and d is a thickness of the oxide semiconductor layer.

[FORMULA 4]

$$\varepsilon = C_a \frac{1}{\varepsilon_0} \frac{d}{S} \quad (4)$$

By increasing the relative permittivity of the oxide semiconductor layer serving as an active layer of a transistor, the on current or drive force of the transistor can be increased. (the first object)

With use of a structural body as illustrated in FIG. 4A, the relative permittivity of an oxide semiconductor which is a semi-insulating layer can be calculated. (the second object)

BEST MODE FOR CARRYING OUT THE INVENTION

Embodiments will be described in detail with reference to the accompanying drawings.

It is easily understood by those skilled in the art that modes and details thereof can be modified in various ways without departing from the spirit and scope of the present invention. Therefore, the present invention should not be interpreted as being limited to what is described in the embodiments described below.

In the structures to be given below, the same portions or portions having similar functions are denoted by the same reference numerals in different drawings, and explanation thereof will not be repeated.

The following embodiments can be combined with each other, as appropriate.

(Embodiment 1)

An example of a method for manufacturing a semiconductor device will be described.

Figure 1A:
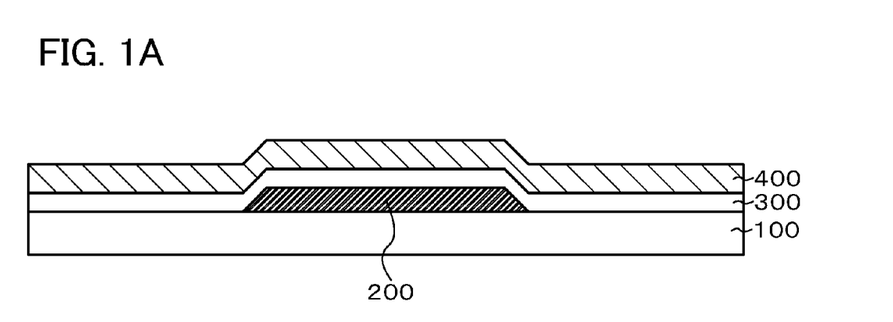
FIGS. 1A to 1C illustrate an example of a method for manufacturing a semiconductor device.

First, a gate electrode 200 is formed over a substrate 100 having an insulating surface, a gate insulating layer 300 is formed over the gate electrode 200, and an oxide semiconductor layer 400 is formed over the gate insulating layer 300 (FIG. 1A).

A material of a substrate is not limited. For example, a glass substrate, a quartz substrate, a metal substrate, a plastic substrate, a semiconductor substrate, or the like can be used.

In the case where an insulating substrate is used as the substrate, the substrate has an insulating surface.

On the other hand, in the case where a metal substrate, a semiconductor substrate, or the like is used as the substrate, the substrate can have an insulating surface when a base insulating layer is formed on the substrate.

Note that a base insulating layer may be formed over the substrate also in the case where an insulating substrate is used as the substrate.

The gate electrode is formed using a conductive material. For example, aluminum, titanium, molybdenum, tungsten, gold, silver, copper, doped silicon, a variety of alloys, an oxide conductive layer (typically, indium tin oxide or the like), or the like can be used, but the conductive layer is not limited to these examples. The gate electrode may have a single-layer structure or a stacked structure.

The gate insulating layer is formed using an insulating material. For example, a silicon oxide film, a silicon nitride film, a silicon oxide film including nitrogen, a silicon nitride film including oxygen, an aluminum nitride film, an aluminum oxide film, a film obtained by oxidizing or nitriding a semiconductor layer, a film obtained by oxidizing or nitriding a semiconductor substrate, a hafnium oxide film, or the like can be used, but the insulating layer is not limited to these examples. The gate insulating layer may have a single-layer structure or a stacked structure.

In order to prevent carriers from being injected to the oxide semiconductor layer, a layer which contains hydrogen as little as possible is preferably used for the gate insulating layer.

The preferred gate insulating layer which contains hydrogen as little as possible is a gate insulating film formed using a formation gas which does not contain hydrogen (H) or hydride ($SiH_4$ or the like).

In terms of a small amount of hydrogen, a sputtering method is preferable to a plasma CVD method for formation of the gate insulating layer because a plasma CVD method uses hydride ($SiH_4$ or the like).

However, a gate insulating layer formed by a plasma CVD method has fewer defects and superior film quality than/to a gate insulating layer formed by a sputtering method. That is, in some cases, a transistor including a gate insulating layer formed by a plasma CVD method has higher properties than that including a gate insulating layer formed by a sputtering method; accordingly, a plasma CVD method and a sputtering method may be used as appropriate depending on need. Note that in the case of using a gate insulating layer formed by a plasma CVD method, a substance including a hydrogen atom is discharged by performance of heat treatment. Thus, when a plasma CVD method is employed, heat treatment (equal to or higher than 200° C. and equal to or lower than 1000° C. (preferably, equal to or higher than 300° C. and equal to or lower than 800° C.)) is preferably performed after formation of the gate insulating layer.

Note that a substance including a hydrogen atom includes hydrogen, water, hydroxide, hydride, and the like.

As the oxide semiconductor layer, the following oxide semiconductors can be used, but not limited to: In—Ga—Zn—O-based oxide (containing indium, gallium, zinc, and oxygen as the main components); In—Sn—Zn—O-based oxide (containing indium, tin, zinc, and oxygen as the main components); In—Al—Zn—O-based oxide (containing indium, aluminum, zinc, and oxygen as the main components); Sn—Ga—Zn—O-based oxide (containing tin, gallium, zinc, and oxygen as the main components); Al—Ga—Zn—O-based oxide (containing aluminum, gallium, zinc, and oxygen as the main components); Sn—Al—Zn—O-based oxide (containing tin, aluminum, zinc, and oxygen as the main components); In—Zn—O-based oxide (containing indium, zinc, and oxygen as the main components); Sn—Zn—O-based oxide (containing tin, zinc, and oxygen as the main components); Al—Zn—O-based oxide (containing aluminum, zinc, and oxygen as the main components); In—O-based oxide (oxide of indium (indium oxide)); Sn—O-based oxide (oxide of tin (tin oxide)), Zn—O-based oxide (oxide of zinc (zinc oxide)); and the like.

The lower limit of the relative permittivity of the oxide semiconductor can be selected from equal to or higher than 13 (or higher than 13), equal to or higher than 14 (or higher than 14), equal to or higher than 14.7 (or higher than 14.7), and equal to or higher than 16.7 (or higher than 16.7).

The higher relative permittivity is preferable, and the upper limit is not necessarily provided.

If the upper limit of the relative permittivity of the oxide semiconductor is provided, it can be selected from equal to or lower than 16.7 (or lower than 16.7), equal to or lower than 17 (or lower than 17), equal to or lower than 18 (or lower than 18), equal to or lower than 20 (or lower than 20), equal to or lower than 25 (or lower than 25), equal to or lower than 30 (or lower than 30), equal to or lower than 40 (or lower than 40), equal to or lower than 50 (or lower than 50), equal to or lower than 60 (or lower than 60), and equal to or lower than 70 (or lower than 70).

In the case where the oxide semiconductor layer is formed by a sputtering method, a preferred sputtering target does not contain a substance including a hydrogen atom.

Further, when the oxide semiconductor layer is formed, it is preferable that leak in the deposition chamber be prevented so as not to allow entry of a substance including a hydrogen atom from the outside.

Figure 1B:
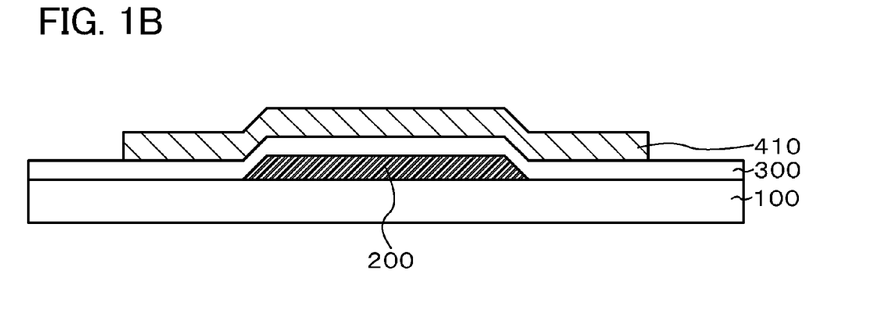

Next, the oxide semiconductor layer 400 is etched to have an island shape, so that an oxide semiconductor layer 410 is formed (FIG. 1B).

Next, first heat treatment (equal to or higher than X ° C. and lower than Y ° C.) of the oxide semiconductor layer is performed. Note that although the first heat treatment is not a needed step, it is preferably performed.

An atmosphere for the first heat treatment can be selected as appropriate from a nitrogen atmosphere, a rare gas atmosphere, an oxygen atmosphere, an atmosphere including oxygen and nitrogen, an atmosphere including oxygen and a rare gas, an atmosphere including nitrogen and a rare gas, an atmosphere including oxygen, nitrogen, and a rare gas, and the like.

The first heat treatment may be performed before the oxide semiconductor layer 410 is formed by etching the oxide semiconductor layer 400 into an island shape.

While the oxide semiconductor layer 400 is being etched to form an island-shaped oxide semiconductor layer 410, the oxide semiconductor layer is exposed to water from a photoresist and a resist stripper.

Thus, in order to remove water from a photoresist and a resist stripper, it is preferable that the first heat treatment be performed after the oxide semiconductor layer 410 is formed by etching the oxide semiconductor layer 400 into an island shape.

The lower limit temperature (X ° C.) of the first heat treatment can be selected from equal to or higher than 350° C. (or higher than 350° C.), equal to or higher than 400° C. (or higher than 400° C.), equal to or higher than 450° C. (or higher than 450° C.), equal to or higher than 500° C. (or higher than 500° C.), equal to or higher than 550° C. (or higher than 550° C.), equal to or higher than 600° C. (or higher than 600° C.), equal to or higher than 650° C. (or higher than 650° C.), equal to or higher than 700° C. (or higher than 700° C.), and equal to or higher than 750° C. (or higher than 750° C.).

In the first heat treatment, a heating method using a furnace, an oven, gas RTA, or the like is preferably used.

Gas RTA is a method in which an object to be processed is put into a gas heated at high temperature for a short time period (several minutes to several tens minutes) to be heated rapidly.

The higher temperature is preferable for the first heat treatment; thus, the upper bound is not necessarily provided.

However, the preferred upper bound temperature (Y ° C.) of the first heat treatment is lower than the upper temperature limit of the substrate.

The upper bound temperature (Y ° C.) of the first heat treatment can be selected from equal to or lower than 1000° C. (or lower than 1000° C.), equal to or lower than 900° C. (or lower than 900° C.), equal to or lower than 800° C. (or lower than 800° C.), and equal to or lower than 700° C. (or lower than 700° C.).

The time for the first heat treatment is preferably one hour or longer. The upper limit of the time is not particularly limited; however, in terms of shortening the treatment time and suppression of crystallization, the time can be selected from equal to or shorter than 10 hours, equal to or shorter than nine hours, and equal to or shorter than eight hours.

In the case of performing gas RTA for the first heat treatment, the time is preferably three minutes or longer. The upper bound of the time is not particularly limited; however, in terms of shortening the treatment time and suppression of crystallization, the time can be selected from equal to or shorter than one hour, equal to or shorter than 50 minutes, and equal to or shorter than 40 minutes.

Note that from the experimental result, it has been found that the electric characteristics of a transistor be improved by performing baking using a furnace at 350° C. for one hour. Specifically, the off current of such a transistor was reduced more than that of a transistor which was not subjected to heat treatment.

When measurement was performed with thermal desorption spectroscopy (TDS), a peak of water at around 300° C. was not observed in a sample which had been baked at 450° C. for one hour with use of a furnace. In also a sample which had been baked at 650° C. for three minutes with use of gas RTA, a peak of water at around 300° C. was not observed. On the other hand, in a sample which had been baked at 350° C. for one hour, a peak of water at around 300° C. was observed.

When measurement was performed with secondary ion mass spectrometry (SIMS), the hydrogen concentration in a sample which had been baked at 550° C. for one hour is approximately one digit smaller than that of a sample which had been baked at 450° C. for one hour.

An increase in heating temperature allowed electric characteristics of the transistor to be improved.

In particular, in the sample which had been subjected to heat treatment using a furnace at equal to or higher than 450° C. and the sample which had been subjected to heat treatment using gas RTA at equal to or higher than 650° C., variation in electric characteristics of the transistors were reduced.

A reduction of variation in electric characteristics of the transistor was considered to be caused by a decrease in an impurity (a substance including a hydrogen atom) which affects the transistor, in an oxide semiconductor layer.

In other words, hydrogen serves as a donor in the oxide semiconductor layer.

Therefore, the substance including a hydrogen atom affects operation of the transistor.

When a hydrogen atom or a compound including a hydrogen atom is contained in the oxide semiconductor, a carrier is generated, and the transistor becomes a normally-on transistor.

As a result, a problem of shifting the threshold voltage or operation voltage of the transistor arises.

Further, the substance including a hydrogen atom serves as a space charge in the oxide semiconductor, which decreases the relative permittivity of the oxide semiconductor.

Then, when the relative permittivity decreases, the on current or drive force of the transistor is reduced.

Therefore, it is preferable that the substance including a hydrogen atom in the oxide semiconductor layer be reduced as much as possible.

Note that the higher energy is applied to the oxide semiconductor, the more likely the substance including a hydrogen atom is to be discharged; accordingly, the heating temperature is preferably set to high and the heating time is preferably set to long.

However, if the energy applied to the oxide semiconductor is made excessively high, the oxide semiconductor is crystallized and the relative permittivity of the oxide semiconductor is reduced.

Therefore, the upper limit of the heating time and the upper bound of the heating temperature for the first heat treatment preferably employ the above-described values.

Figure 1C:
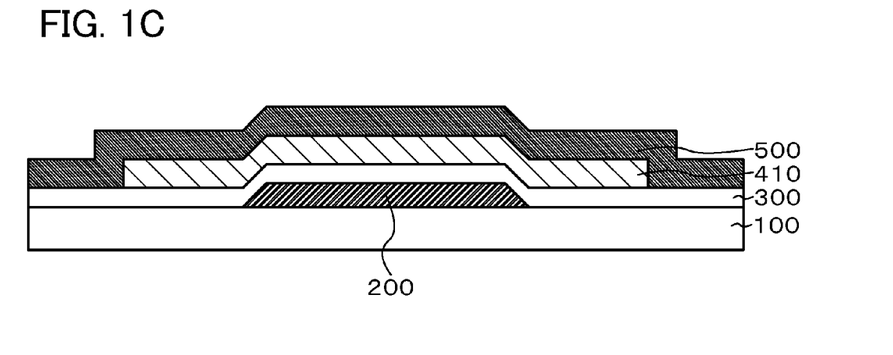

Next, a conductive layer 500 is formed over the oxide semiconductor layer 410 (FIG. 1C).

The conductive layer is formed using a conductive material. For example, aluminum, titanium, molybdenum, tungsten, yttrium, indium, gold, silver, copper, doped silicon, an alloy including any of the conductive materials, or an oxide conductive layer (typically, indium tin oxide and the like) can be used, but the conductive layer is not limited to these examples. The conductive layer may have a single-layer structure or a stacked structure.

Note that the conductive layer in contact with the oxide semiconductor layer is formed using titanium, indium, yttrium, an alloy of indium and zinc, a gallium alloy (such as gallium nitride), or the like, whereby contact resistance between the oxide semiconductor layer and an electrode (wiring) formed by etching the conductive layer can be reduced.

The reason why contact resistance can be reduced is that the electron affinity of titanium, indium, yttrium, an alloy of indium and zinc, a gallium alloy (such as gallium nitride), and the like is lower than the electron affinity of the oxide semiconductor layer.

That is, in the case where the conductive layer is the single layer, the conductive layer is preferably formed using a metal (or an alloy or a compound) having lower electron affinity than the oxide semiconductor layer.

On the other hand, in the case where the conductive layer has a stacked structure, a metal (or an alloy or a compound) having lower electron affinity than the oxide semiconductor layer is preferably provided to be in contact with the oxide semiconductor layer.

A material such as titanium (Ti), indium (In), yttrium (Y), an ally of indium (In) and zinc (Zn), a gallium (Ga) alloy (such as gallium nitride), and the like has high resistivity. A material such as aluminum (Al), gold (Au), silver (Ag), copper (Cu), a variety of alloys, and the like has low resistivity. Thus, such a high-resistivity material is preferably stacked over the conductive layer in which such a low-resistivity material is provided to be in contact with the oxide semiconductor layer.

Specifically, there are a variety of structures such as a structure in which Ti and Al are stacked in this order, a structure in which Ti and an Al alloy are stacked in this order, a structure in which Y and Al are stacked in this order, a structure in which Y and an Al alloy are stacked in this order, a structure in which Ti, Al, and Ti are stacked in this order, a structure in which Ti, an Al alloy, and Ti are stacked in this order, a structure in which In, Al, and Mo are stacked in this order, a structure in which Y, Al, and Ti are stacked in this order, a structure in which Mo, Al, and Ti are stacked in this order, and a structure in which Ti, an Al alloy, Mo, and Ti are stacked in this order; the structure of the conductive layer is not limited to the above structures. That is, the number of layers in the conductive layer is not limited, and the combination of the conductive layers is not limited. Thus, the combination which is not cited here may be described in claims.

Note that an alloy having low resistivity indicates an alloy of any one of aluminum, gold, silver, copper, and the like and another substance. For example, an alloy of Al and Si, an alloy of Al and Ti, an alloy of Al and Nd, an alloy of Cu, Pb, and Fe, an alloy of Cu and Ni, and the like can be given.

Note that in the case of using an oxide conductive layer as the conductive layer, a material similar to that of the oxide semiconductor layer can be used.

The oxide conductive layer may have lower resistivity than the oxide semiconductor layer used in a channel formation region.

Here, the oxide conductive layer is an oxide in which many substances including a hydrogen atom or oxygen vacancies are intentionally contained. The substance including a hydrogen atom or oxygen vacancy induces a carrier, which can increase conductivity of the oxide.

In contrast, the oxide semiconductor layer is an oxide in which a substance including a hydrogen atom or oxygen vacancy is not intentionally contained.

That is, resistivity can be controlled by adjusting the amount of substances including a hydrogen atom or the level of oxygen vacancies.

If the oxide conductive layer is formed using an oxide semiconductor which is different from and has lower resistivity than the oxide semiconductor used in the channel formation region, it is unnecessary to control resistivity by adjusting the amount of substances including a hydrogen atom and the level of oxygen vacancies.

Figure 2A:
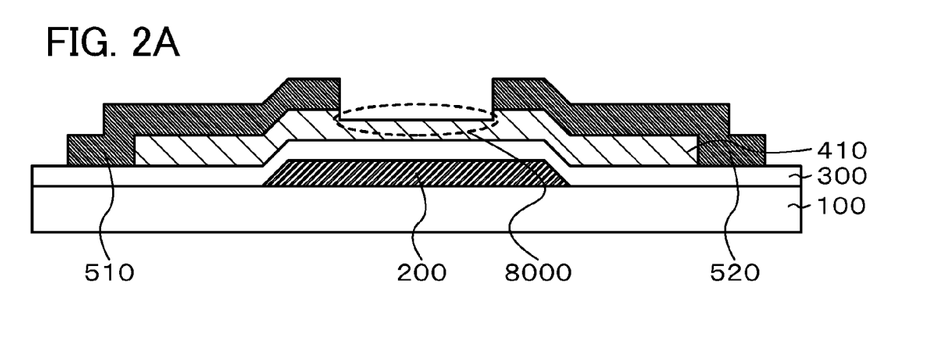
FIGS. 2A and 2B illustrate an example of a method for manufacturing a semiconductor device.

Next, the conductive layer 500 is etched, so that a plurality of electrodes or wirings (a source electrode (contact electrode), a drain electrode (contact electrode), a wiring, and the like) are formed (FIG. 2A). In FIG. 2A, a contact electrode 510, a contact electrode 520, and the like are illustrated.

At the stage of the step illustrated in FIG. 2A, a transistor (a channel-etch transistor) is completed.

Figure 2B:
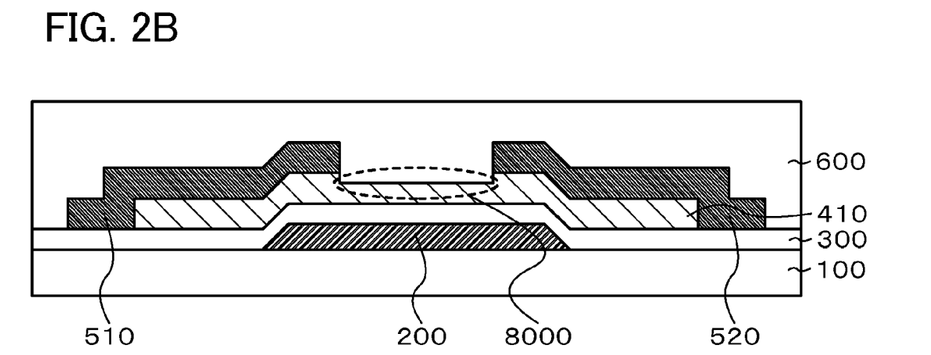

Note that a portion of an oxide semiconductor region 8000 surrounded by a dashed line in FIGS. 2A and 2B is slightly etched when the conductive layer 500 is etched.

If a (fixed) charge exists in the oxide semiconductor region 8000 surrounded by the dashed line, this region also serves as a channel in some cases. In that case, this region is called a back channel.

For example, since hydrogen serves as a donor in the oxide semiconductor, when hydrogen is contained in the oxide semiconductor region 8000, resistance is reduced and a back channel is formed.

Next, an insulating layer 600 (a protective film or an interlayer insulating film) which covers the transistor is formed (FIG. 2B).

The insulating layer is formed using an insulating material. For example, a silicon oxide film, a silicon nitride film, a silicon oxide film including nitrogen, a silicon nitride film including oxygen, an aluminum nitride film, an aluminum oxide film, a siloxane film, an acrylic film, a polyimide film, and the like can be used, but the insulating layer is not limited to the above examples. The interlayer insulating film may have a single-layer structure or a stacked structure.

Here, electric characteristics of the transistor were compared on the condition that the kind of a film of the insulating layer 600 was changed. As a result, it was found that the transistor can have higher electric characteristics in the case where hydrogen was not contained in the insulating layer which is in contact with the oxide semiconductor region 8000 surrounded by the dashed line.

In order words, an insulating layer formed by a sputtering method is much preferable for the insulating layer 600.

When the substance including a hydrogen atom is contained in the oxide semiconductor region 8000 surrounded by the dashed line, the threshold voltage of the transistor ($V_{th}$) is shifted in the negative direction.

That is, when the substance including a hydrogen atom is contained in the oxide semiconductor region 8000 surrounded by the dashed line, the transistor becomes a normally-on transistor and the operation voltage of the transistor is shifted.

In particular, in the case where an insulating layer is formed by a plasma CVD method, a substance including a hydrogen atom (typically, $SiH_4$ or the like) is used; accordingly, the substance including a hydrogen atom is added to the oxide semiconductor region 8000 surrounded by the dashed line.

Further, in the case of forming a siloxane film, an acrylic film, a polyimide film, or the like which contains a large amount of water, the oxide semiconductor region 8000 surrounded by the dashed line is constantly supplied with the substance including a hydrogen atom.

Thus, it is preferable that a layer which contains few substances including a hydrogen atom be used for the insulating layer in contact with the oxide semiconductor region 8000 surrounded by the dashed line, so as to prevent a back channel to be formed.

Note that the step illustrated in FIG. 2B can be regarded as a step in which the insulating layer 600 is formed over the contact electrode 510, the contact electrode 520, and the back channel (the portion of the oxide semiconductor region 8000 surrounded by the dashed line).

A contact hole may be formed in the insulating layer 600 and a pixel electrode may be formed over the insulating layer 600. After formation of the pixel electrode, a display element (such as an EL element or a liquid crystal element) is formed, so that a display device can be formed.

A contact hole may be formed in the insulating layer 600, and a wiring may be formed over the insulating layer 600.

After the wiring is formed over the insulating layer 600, an insulating layer, a wiring, a transistor, a display element, an antenna, or the like may be formed over the wiring.

Further, after the insulating layer 600 is formed, second heat treatment is preferably performed at equal to or higher than 100° C. and equal to or lower than 300° C. (preferably, equal to or higher than 200° C. and equal to or lower than 250° C.). Note that although the second heat treatment is not a needed step, it is preferable to be performed.

The preferable heating time is equal to or longer than one hour and equal to or shorter than 10 hours.

The second heat treatment may be performed immediately after formation of the insulating layer 600, immediately after formation of the wiring, or immediately after formation of the pixel electrode. That is, the second heat treatment may be performed at any time after the insulating layer 600 is formed.

Note that, when the second heat treatment is performed, the insulating layer 600 is made in an oxygen-excess state, whereby oxygen is supplied to the oxide semiconductor layer and oxygen vacancies in the oxide semiconductor layer are reduced. That is, since the oxygen vacancies serving as a donor are reduced, the back channel is unlikely to be formed.

As examples of a method for forming an oxygen-excess insulating layer, the following methods can be used: a method in which oxygen flow is increased in a reactive sputtering with use of a nonoxide target (such as silicon or aluminum) as a sputtering target and oxygen as a sputtering gas; a method in which an oxide target (such as silicon oxide or aluminum oxide) is used as a sputtering target and oxygen is used as a sputtering gas (generally, oxygen is unnecessary in the case of using an oxide target); and a method in which oxygen is introduced into an insulating layer by ion injection or ion doping after the insulating layer is formed. However, the method is not limited to the above examples. Note that in the case of performing reactive sputtering, a gas such as argon is not used but a 100% oxygen gas is used as a sputtering gas, which is preferable.

Note that from the experiment, it was revealed that in the case of performing heat treatment after an oxygen-excess silicon oxide film had been formed by a sputtering method as the insulating layer 600, electric characteristics of the transistor were improved more than those of the transistor before the heat treatment.

Further, from the experiment, it was found that even in the case where the insulating layer 600 was an insulating layer other than an oxygen-excess silicon oxide film formed by a sputtering method, electric characteristics of the transistor were improved by performance of heat treatment as compared to those of the transistor which was not subjected to heat treatment.

That is, the electric characteristics of the transistor are improved by performance of the second heat treatment even in the case where an oxygen-excess silicon oxide film formed by a sputtering method is not used as the insulating layer 600. The above improvement is caused by not the effect of supply of oxygen into the oxide semiconductor layer but a reduction in the substance including a hydrogen atom (particularly, water or hydrogen) in the insulating layer by the second heat treatment.

Part of or all the contents described in this embodiment can be combined with other embodiments.

(Embodiment 2)

In this embodiment, a semiconductor device including a transistor with a structure different from that in Embodiment 1 will be described.

Note that for layers of the transistor, materials and the like which are similar to those described in Embodiment 1 can be used.

Figure 3A:
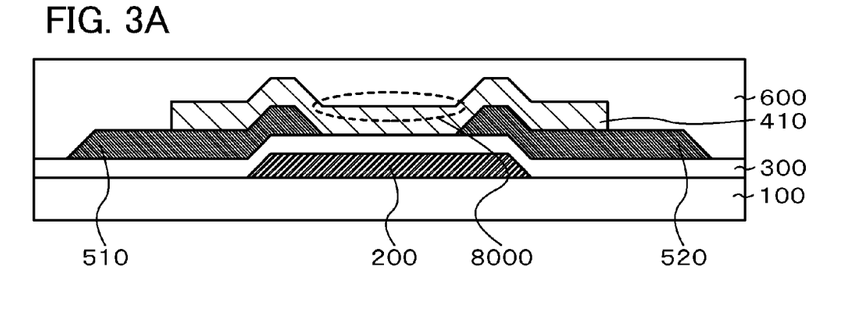
FIGS. 3A to 3C illustrate examples of semiconductor devices.

A transistor illustrated in FIG. 3A is a bottom-gate bottom-contact (BGBC) transistor, which includes the gate electrode 200 provided over the substrate 100 having an insulating surface, the gate insulating layer 300 provided over the gate electrode 200, the contact electrode 510 and the contact electrode 520 provided over the gate insulating layer 300, and the oxide semiconductor layer 410 (having an island shape) provided over the gate insulating layer 300, the contact electrode 510, and the contact electrode 520.

Note that the insulating layer 600 which covers the transistor is provided.

Further, in some cases, a back channel is formed in the oxide semiconductor region 8000 surrounded by the dashed line.

Figure 3B:
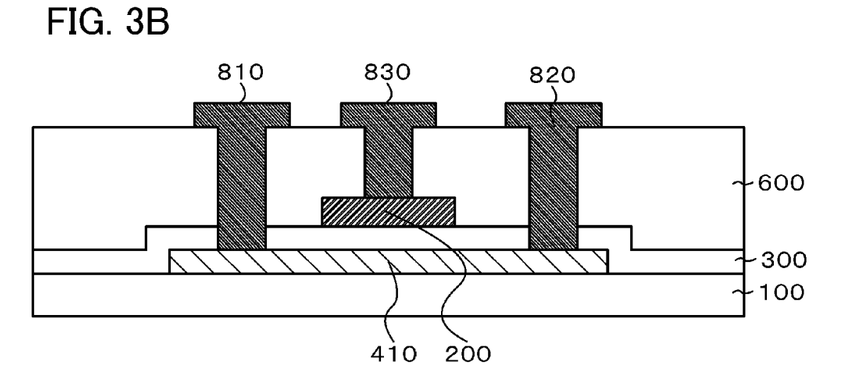

A transistor illustrated in FIG. 3B is a top-gate transistor, which includes the oxide semiconductor layer 410 (having an island shape) provided over the substrate 100 having an insulating surface, the gate insulating layer 300 provided over the oxide semiconductor layer 410, and the gate electrode 200 provided over the gate insulating layer 300.

Note that the insulating layer 600 which covers the transistor is provided, and through contact holes provided in the insulating layer 600, a wiring 810, a wiring 820, and a wiring 830 are provided.

Figure 3C:
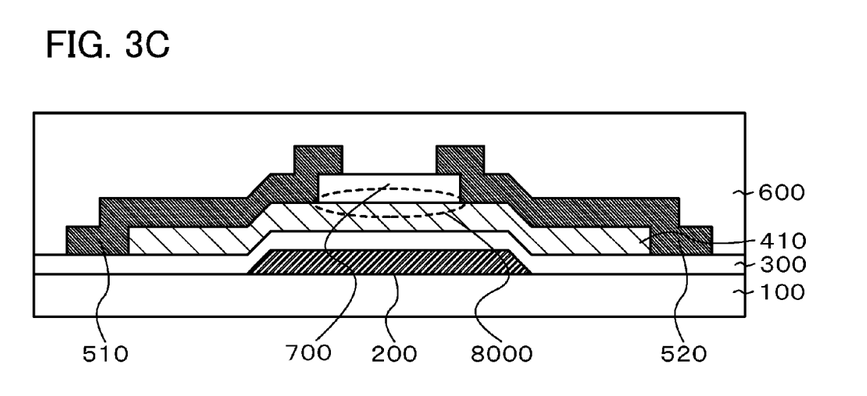

A transistor illustrated in FIG. 3C is a channel-stop transistor, which includes the gate electrode 200 provided over the substrate 100 having an insulating surface, the gate insulating layer 300 provided over the gate electrode 200, the oxide semiconductor layer 410 (having an island shape) provided over the gate insulating layer 300, a channel protective layer 700 provided over the oxide semiconductor layer 410, and the contact electrode 510 and the contact electrode 520 provided over the oxide semiconductor layer 410 and the channel protective layer 700.

Note that the insulating layer 600 which covers the transistor is provided.

Further, a back channel is formed in the oxide semiconductor region 8000 surrounded by the dashed line in some cases.

Here, as a material of the channel protective layer 700, a material similar to the material of the insulating layer 600 described in Embodiment 1 can be used. The material of the channel protective layer 700 and the material of the insulating layer 600 can be the same or different from each other.

Further, in the channel-stop transistor, not the insulating layer 600 but the channel protective layer 700 is in contact with the region where a back channel is formed. That is, the channel protective layer 700 is in contact with the oxide semiconductor region 8000 surrounded by the dashed line.

Therefore, a layer which contains few substances including a hydrogen atom is preferably used for the channel protective layer 700.

As described above, the transistor may have any structure.

That is, the transistor may have any structure as long as it includes at least a gate electrode, an oxide semiconductor layer, and a gate insulating layer sandwiched between the gate electrode and the oxide semiconductor layer.

Thus, a structure of a transistor of the invention disclosed is not limited to the structures described in Embodiment 1 and Embodiment 2.

Part of or all the contents described in this embodiment can be combined with other embodiments.

(Embodiment 3)

A novel method for calculating the relative permittivity $\in$ of an oxide semiconductor layer with use of C-V characteristics will be described.

First, the MOS capacitor (measurement apparatus) illustrated in FIG. 4A is formed.

The MOS capacitor (measurement apparatus) illustrated in FIG. 4A is a novel one.

As illustrate in FIG. 4A, the oxide semiconductor layer 1002 (Oxide Semiconductor) is provided over the silicon wafer 1001 (Silicon Wafer), and the gate electrode layer 1003 (Gate Electrode) is provided over the oxide semiconductor layer 1002 (Oxide Semiconductor). Note that the silicon wafer 1001 may be n-type or p-type.

Note that a rear electrode layer may be formed below the silicon wafer 1001.

Materials of the gate electrode layer and the rear electrode layer can be conductive materials.

The band gap of the oxide semiconductor is wider than that of silicon.

Therefore, there is a potential barrier between the conduction band of the oxide semiconductor and the conduction band of silicon. Similarly, there is a potential barrier between the valence band of the oxide semiconductor and the valence band of silicon.

Since such potential barriers exist at an interface between the oxide semiconductor layer 1002 and the silicon wafer 1001, injection of carriers from the gate electrode layer 1003 or the silicon wafer 1001 into the oxide semiconductor layer 1002 can be suppressed. As a result, C-V characteristics can be obtained in the structure illustrated in FIG. 4A.

Thus, instead of the silicon wafer 1001, a semiconductor having a smaller band gap than the oxide semiconductor layer 1002 may be used.

As a semiconductor having a small band gap, silicon (about 1.12 eV), germanium (about 0.67 eV), gallium arsenide (about 1.43 eV), or the like can be used. Note that the band gap of the oxide semiconductor layer (e.g., an In—Ga—Zn—O-based oxide semiconductor layer) is about 3 to 3.7 eV.

The semiconductor may have either a wafer shape (substrate shape) or a film shape.

Note that the relative permittivity of wide-band-gap semiconductors other than the oxide semiconductor can be measured. The wide-band-gap semiconductors include silicon carbide (about 3 eV), gallium nitride (about 3.4 eV), aluminum nitride (5.9 eV), diamond (5.27 eV), and the like. In this case, a semiconductor whose relative permittivity is to be measured may be replaced with the oxide semiconductor layer in FIG. 4A.

That is, with use of the structure in FIG. 4A, the relative permittivity of a semiconductor whose band gap is 2.5 eV (or 3 eV or more) can be measured.

Figure 5:
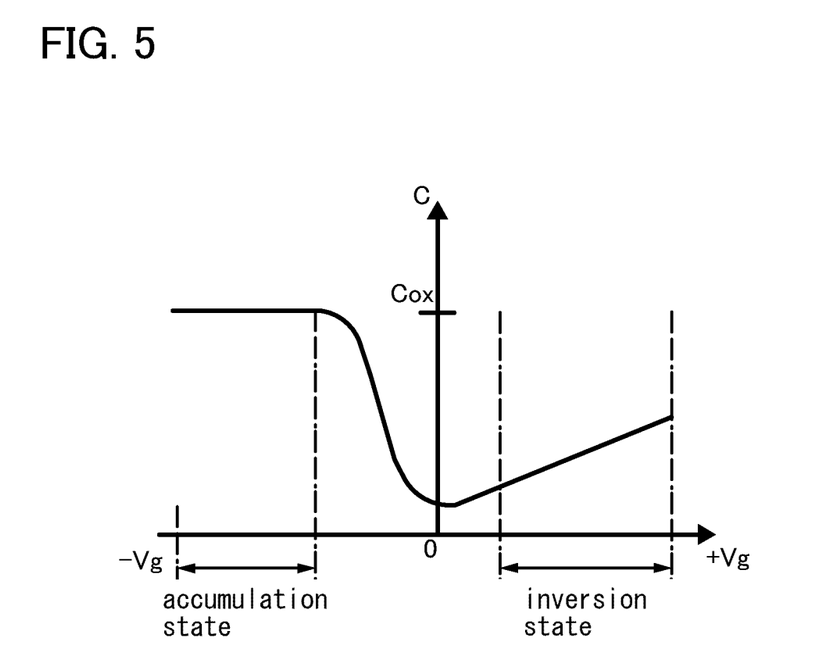
FIG. 5 shows an example of a C-V measurement result.

FIG. 5 shows C-V characteristics in the case of using a p-type silicon wafer. Here, in an inversion state (inversion region, where $V_g$ is positive), the capacitance is the sum of the depletion layer capacitance of the p-type silicon wafer and the capacitance of the oxide semiconductor layer.

On the other hand, in an accumulation state (accumulation region, where $V_g$ is negative), an inversion layer is not formed; thus, the capacitance is equal to the capacitance of the oxide semiconductor layer and is saturated.

Then, the saturation capacitance $C_a$ in an accumulation state can be obtained by the mathematical formula (13), where $\epsilon_0$ is the vacuum permittivity, d is the thickness of the oxide semiconductor layer, and S is the area of the gate electrode.

[FORMULA 5]

$$C_a = \varepsilon_0 \varepsilon \frac{S}{d} \quad (3)$$

By modifying the mathematical formula (3), the mathematical formula (4) can be obtained.

[FORMULA 6]

$$\varepsilon = C_a \frac{1}{\varepsilon_0} \frac{d}{S} \quad (4)$$

The thickness d of the oxide semiconductor layer and the area S of the gate electrode are designed values set at the time of manufacturing the MOS capacitor (measurement apparatus).

Note that as the vacuum permittivity $\epsilon_0$, the value $(8.85418782 \times 10^{-12} \text{ m}^{-3}\text{kg}^{-1}\text{s}^4\text{A}^2)$ may be used.

By manufacturing a MOS capacitor (measurement apparatus) having a special structure as illustrated in FIG. 4A in the above manner, the relative permittivity can be calculated using the mathematical formula (4).

Part of or all the contents described in this embodiment can be combined with other embodiments.

EXAMPLE 1

The structure of FIG. 4A was formed and the CV measurement of the oxide semiconductor layer was performed, whereby the relative permittivity of the oxide semiconductor layer was calculated.

First, a 300-nm-thick In—Ga—Zn—O-based oxide semiconductor layer was formed over a p-type silicon wafer. Next, a silver electrode with a thickness of 300 nm was formed over the oxide semiconductor layer (FIG. 4A).

As the deposition condition of the oxide semiconductor layer, an In—Ga—Zn—O-based target whose molar ratio of In:Ga:Zn was 1:1:1 ($In_2O_3$:$Ga_2O_3$:ZnO=1:1:2 (molar ratio)) was used, the power was 0.5 kW, the pressure was 0.4 Pa, the gas flow ratio satisfied the relation of Ar/$O_2$=35/10 sccm, and the substrate temperature was room temperature.

Then, two structural bodies of FIG. 4A formed in the above manner were prepared (Sample 1 and Sample 2).

Sample 1 was subjected to heat treatment in an air atmosphere at 350° C. for one hour.

Sample 2 was subjected to heat treatment in an air atmosphere at 450° C. for one hour.

Note that in the case of using silicon (as a semiconductor), it is preferable to select a heating condition so that silicon is prevented to be oxidized at the interface between silicon and oxide semiconductor.

Then, relative permittivity of each sample was calculated with the method described in Embodiment 3.

As a result, the relative permittivity of Sample 1 (350° C.) was 16.7, and the relative permittivity of Sample 2 (450° C.) was 14.7.

As described above, the In—Ga—Zn—O-based oxide semiconductor layers were formed with use of an oxygen-excess target and a sputtering gas mixed with oxygen, from which oxygen vacancies and a substance including a hydrogen atom which induce carriers were removed. Such In—Ga—Zn—O-based oxide semiconductor layers have high relative permittivity.

Note that since the amount of hydrogen to be removed increases with an increase in heating temperature, carriers in the oxide semiconductor layer which is subjected to heat treatment at higher temperature should be reduced more largely. However, according to this example, the oxide semiconductor layer which was subjected to heat treatment at higher temperature had the lower relative permittivity than the other oxide semiconductor layer. Moreover, the relative permittivity tends to decrease with an increase in crystallinity of the oxide semiconductor layer. Thus, a structure of the oxide semiconductor layer was changed depending on the temperature of the heat treatment, which was considered as the reason why the relative permittivity in the case of employing the higher heating temperature was lower.

In other words, it was considered that the oxide semiconductor was changed from an amorphous structure to a crystalline structure by performance of heat treatment at 450° C. for one hour, which resulted in a decrease in the relative permittivity.

This application is based on Japanese Patent Application serial no. 2009-286234 filed with Japan Patent Office on Dec. 17, 2009, the entire contents of which are hereby incorporated by reference.

EXPLANATION OF REFERENCE

100: substrate, 200: gate electrode, 300: gate insulating layer, 400: oxide semiconductor layer, 410: oxide semiconductor layer, 500: conductive layer, 510: contact electrode, 520: contact electrode, 600: insulating layer, 700: channel protective layer, 810: wiring, 820: wiring, 830: wiring, 1001: silicon wafer, 1002: oxide semiconductor layer, 1003: gate electrode layer, 1101: first electrode, 1102: oxide semiconductor layer, 1103: second electrode, 8000: oxide semiconductor region.

The invention claimed is:

1. A semiconductor device comprising:

a gate electrode;

an oxide semiconductor layer; and a gate insulating layer between the gate electrode and the oxide semiconductor layer, wherein the gate electrode is provided over the oxide semiconductor layer, and wherein a relative permittivity of the oxide semiconductor layer is equal to or higher than 13.

2. A semiconductor device comprising:

a gate electrode;

an oxide semiconductor layer; and a gate insulating layer between the gate electrode and the oxide semiconductor layer, wherein the gate electrode is provided over the oxide semiconductor layer, and wherein a relative permittivity of the oxide semiconductor layer is equal to or higher than 14.

3. The semiconductor device according to claim 1 or 2, wherein the oxide semiconductor layer contains indium, gallium, zinc, and oxygen as a main component.

4. The semiconductor device according to claim 1 or 2, wherein the relative permittivity of the oxide semiconductor layer is equal to or lower than 70.

5. The semiconductor device according to claim 1 or 2, further comprising a channel protective layer over the oxide semiconductor layer.

* * * * *